United States Patent [19]

Brower

[11] 4,345,366

[45] Aug. 24, 1982

[54] SELF-ALIGNED ALL-N+ POLYSILICON CMOS PROCESS

[75] Inventor: Ronald W. Brower, Kettering, Ohio

[73] Assignee: NCR Corporation, Dayton, Ohio

[21] Appl. No.: 198,428

[22] Filed: Oct. 20, 1980

[51] Int. Cl.³ .............................................. H01L 11/14
[52] U.S. Cl. ..................................... 29/571; 29/576 B; 29/577 C; 148/188
[58] Field of Search ................. 29/571, 576 B, 577 C; 148/187, 1.5, 188, 190

[56] References Cited

U.S. PATENT DOCUMENTS

| | | | |
|---|---|---|---|
| 3,608,189 | 9/1971 | Gray | 29/571 |
| 3,646,665 | 3/1972 | Kim | 29/571 |
| 3,700,507 | 10/1972 | Murray | 148/187 |
| 3,986,896 | 10/1976 | Veno et al. | 148/1.5 |
| 4,139,402 | 2/1979 | Steinmaier et al. | 148/188 |
| 4,209,797 | 6/1980 | Egawa et al. | 357/42 |
| 4,277,291 | 7/1981 | Cerofolini et al. | 148/188 X |
| 4,280,272 | 7/1981 | Egawa et al. | 148/1.5 X |

Primary Examiner—G. Ozaki
Attorney, Agent, or Firm—J. T. Cavender; Philip A. Dalton, Jr.; T. Rao Coca

[57] ABSTRACT

Disclosed is a process for forming self-aligned all n+-doped polysilicon gates and interconnections in CMOS integrated circuits. Polysilicon is formed into the n-FET gate, a barrier for the p-FET region and the interconnect pattern. Then, arsenosilicate glass (ASG) is formed over the interconnect and the p-FET gate and N-FET active regions. The p-FET gate is etched using the ASG as a mask. The device is heated driving in impurities from the ASG to n+ dope the polysilicon and form the n-FET source and drain. Then, boron is implanted in the p-FET source and drain regions.

6 Claims, 11 Drawing Figures

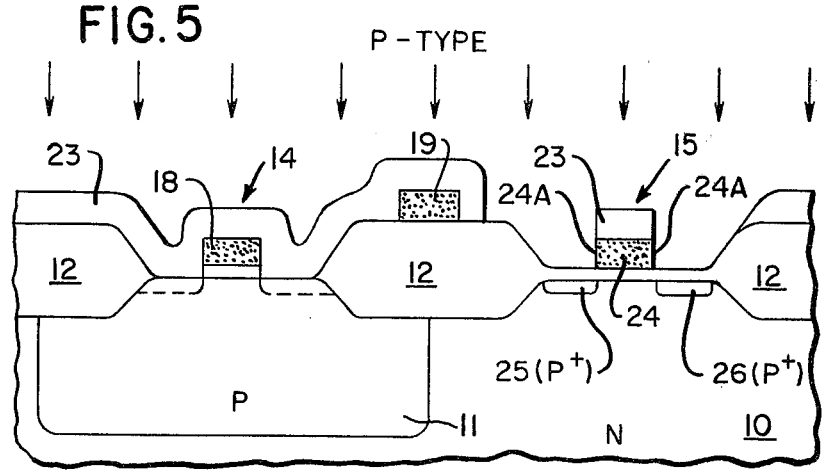
FIG. 5
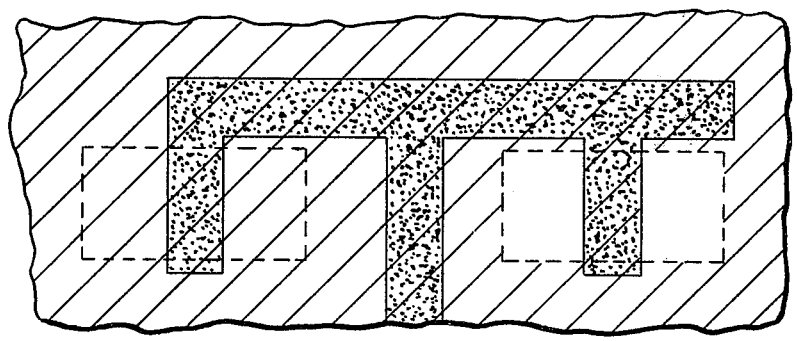
FIG. 5A
FIG. 6
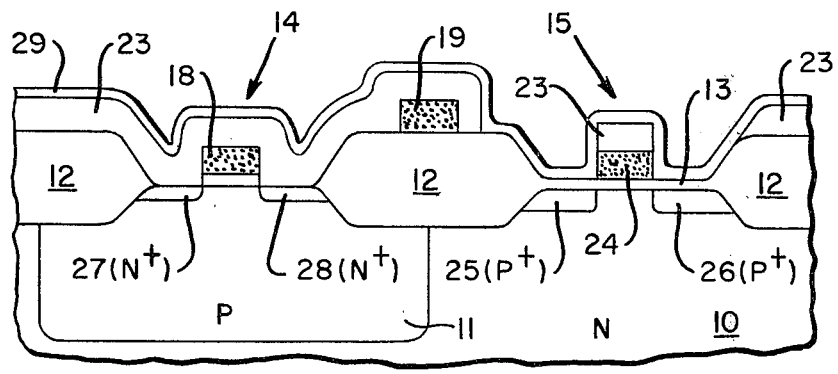

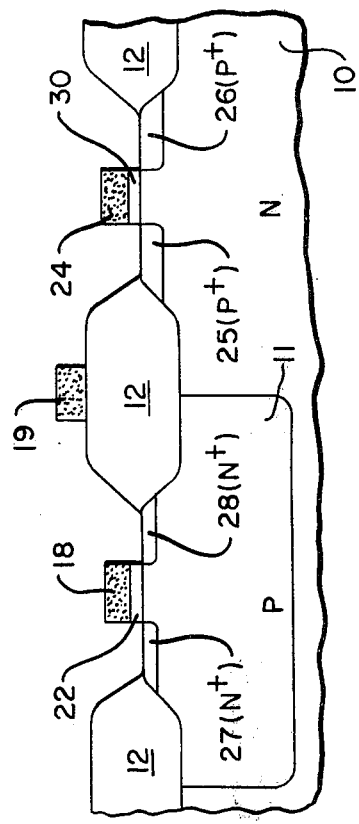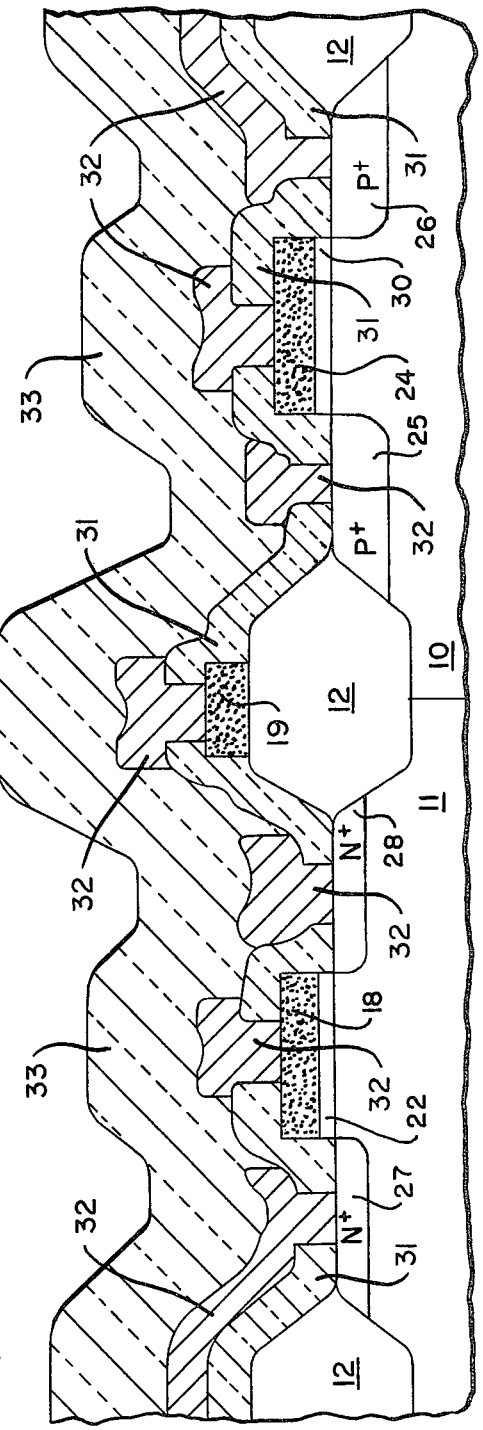
FIG. 7
FIG. 8

SELF-ALIGNED ALL-N+ POLYSILICON CMOS PROCESS

FIELD OF THE INVENTION

The present invention relates generally to CMOS technology, and, more particularly to a process for forming self-aligned all n+-doped polycrystalline silicon (polysilicon or silicon) gates and interconnections in complementary metal oxide semiconductor circuits used, e.g., in very large scale integrated (VLSI) circuits.

BACKGROUND OF THE INVENTION

In a conventional technique for forming CMOS LSI circuits, the process is divided into five major steps for forming: (1) the CMOS well, (2) the isolation oxide, (3) the silicon gate, (4) the sources and drains, and (5) metallization. Typically, the silicon gate in step 3 is formed by depositing or thermally growing the gate insulator, forming the polycrystalline silicon, and etching the polysilicon and gate insulator in the presence of a mask. In one example of prior art techniques, U.S. Pat. No. 4,139,402 issued Feb. 13, 1979, to Steinmaier et al., the process for forming the sources and drains (step 4) can also be used to dope the silicon gates. That is, a layer of phosphorus doped silicon dioxide (PSG) is formed over the n-channel transistor active region and a thermal drive-in step is accomplished to form the n-channel source and drain and to simultaneously dope the n-channel gate n-type. Then the PSG layer is left in place to mask the n-channel transistor active region and p-type source and drain are formed by ion implantation with the p-channel gate being simultaneously doped p-type.

It would appear that the dual use of the PSG layer by Steinmaier et al. eliminates a mask step. Unfortunately, it is preferable to have single-conductivity polysilicon interconnections. Also, as discussed further below, penetration problems associated with boron, the most widely used p-type impurity, make it preferable to use all n-type doped gate electrodes in thin insulator, very large scale integrated circuits.

The polysilicon gates are doped in order to enhance their conductivity and thereby obtain a good control of the device threshold voltage. The polysilicon interconnections are doped to reduce their resistance and thereby increase the speed of operation and reduce power dissipation.

When the polysilicon gate electrode is doped with a p-type impurity, typically boron, a phenomenon called boron penetration occurs. Thin gate insulators allow boron from p-doped polysilicon to diffuse through the insulator to the channel region of the substrate. This uncontrolled p-type channel doping lowers the p-channel transistor threshold voltages and raises n-channel threshold voltages. Consequently, boron p+-gates require relatively thick gate insulators to prevent penetration, but the thick insulator, in turn, decreases the operating speed of the device.

One solution to this problem is to dope all polysilicon gates (both n-channel and p-channel) with an n-impurity, typically phosphorus. This not only allows use of thin gate insulators but makes possible FETs having a higher gain and lower threshold voltage than is possible with p+-polysilicon gates.

One disadvantage of these prior art all-n+ polysilicon gate devices, however, is the difficulty of self-aligning the n+-doped polysilicon gate with the p-channel source and drain in a cost effective manner. In order to obtain the self-aligned feature, the polysilicon must be protected during the p+-doping, and the p+ source and drain areas must be protected during the n+ polysilicon doping step. That is, separate masks must be used for the p-type and n-type transistors. Another disadvantage of the prior art processes is the use of two ion implantation steps, one for forming the p-type transistor and the second for forming the n-type transistor and n+-doping the polysilicon gates and interconnections. A process which would produce an all n+ polysilicon gate structure with fewer masking steps and fewer implantation steps would improve the fabrication yields and therefore the economy of forming such devices.

SUMMARY OF THE INVENTION

The present invention overcomes the above disadvantages of the prior art processes by using the polysilicon conductor layer as a deposition mask during formation of the sources and drains and using a doped glass layer as an etch mask, an implant mask, and a deposition source, thereby eliminating a masking step, permitting all n+ polysilicon doping and preserving self-alignment.

Specifically, the present invention relates to a process for forming CMOS FET integrated circuits which eliminates a masking step in their fabrication. The process is tailored to permit simultaneous n+ polysilicon gate doping for both the p-type and n-type FET's and the polysilicon interconnections. In one embodiment, first, polysilicon is formed into (1) the n-FET gate, (2) a barrier for the active p-FET region, and (3) the interconnect pattern. Then, an n-doped mask such as arsenosilicate glass is formed to completely cover the interconnects, the entire active n-FET region, and the p-FET gate region. The p-FET gate is etched using the arsenosilicate glass as a mask. The device is subjected to a high temperature drive-in to n+ dope the polysilicon (including both gates) and the n-FET source and drain, thus forming a self-aligned n-FET and establishing the desired interconnect conductivity. Then, boron is implanted in the exposed p-FET source and drain regions, forming a self-aligned p-FET.

The process is made possible by the multiple use of a single arsenosilicate glass layer: (1) as an etch mask for the p-FET gate; (2) as a source of n-type dopant for the polysilicon gates and interconnects; (3) for self-aligned formation of n-FET source and drain regions; and (4) as an implantation mask during self-aligned formation of the p-FET source and drain.

Alternatively, the n+ drive-in can be done prior to, or simultaneously with, the p+ ion implantation.

DESCRIPTION OF THE DRAWINGS

FIGS. 2-7 are cross-sectional views illustrating various steps involved in forming a CMOS device using the present invention.

FIG. 5A is a plan view of FIG. 5.

FIG. 8 illustrates in cross-sectional view the finished device.

DETAILED DESCRIPTION OF THE PREFERRED EMBODIMENTS

Reference is now made to FIGS. 1-8 wherein the successive steps of the fabrication process of the present invention are illustrated in detail. The steps to be described hereinafter are illustrative of one technique for implementing the process of the subject invention. In addition, it should be noted that the specific processes for implementing the various steps of the fabrication method are well-known in the art and may be carried out in a number of different ways which are readily apparent to those of ordinary skill in the art.

Figure 1:
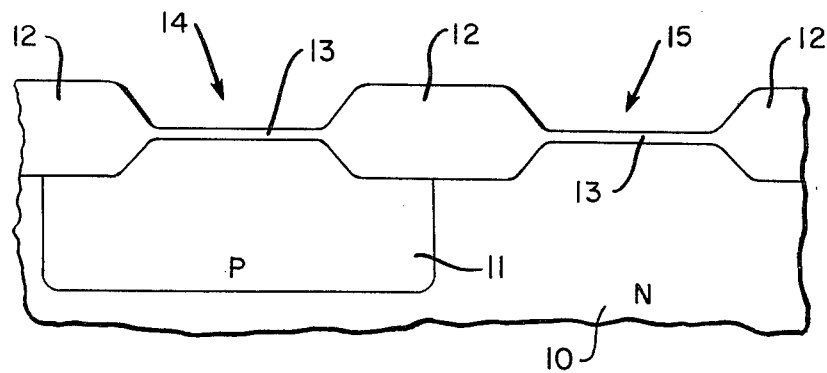
FIG. 1 illustrates in a cross-sectional view the oxide isolation and the CMOS p-well process used in the present invention.

FIG. 1 shows a portion of a semiconductor substrate 10 having a well region 11 formed therein adjacent to its surface. Electrical isolation of adjacent devices is achieved by thick silicon dioxide regions 12 grown using a conventional localized oxidation of silicon (LOCOS) process at an elevated temperature (typically in the range 900°-1200° C.) for 1-20 hours. The thickness range of the region 12 so formed is typically 10,000-20,000 Angstroms (1-2 microns). After implantation of the well with the desired type of impurities followed by diffusion of the impurities to the proper depth, a relatively thin layer of silicon dioxide 13 is grown over the active regions 14 and 15. The oxide layer 13 is grown in the conventional manner in a dry oxygen atmosphere at a temperature of 700°-1000° C. for a period of 1-4 hours. The thickness of this thin oxide layer grown in this manner is in the range of 300-1200 Angstroms (0.03-0.12 microns). In the embodiment shown, the well 11 is p-type and is formed in an n-type substrate 10. This is only exemplary of the fabrication of a class of devices which embody the principles of the present invention, for it is readily possible to fabricate a CMOS device having a n-well in a p-type substrate. In addition, it should be noted that the thicknesses and other dimensions shown herein are selected for clarity of illustration and are not to be interpreted in a limiting sense. The dimensions can be smaller or larger depending upon the operating environment in which the device is going to be used. In this regard, it should be further pointed out at this time that the goal of microelectronics technology is toward smaller dimensions to achieve greater device density, better performance, etc.

Figure 2:
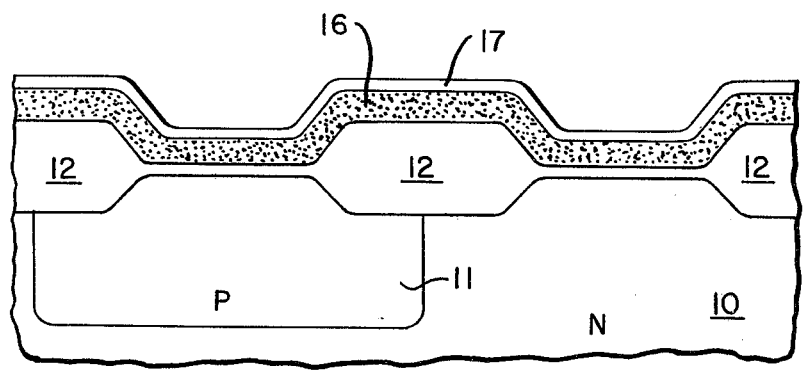
Figure 3:
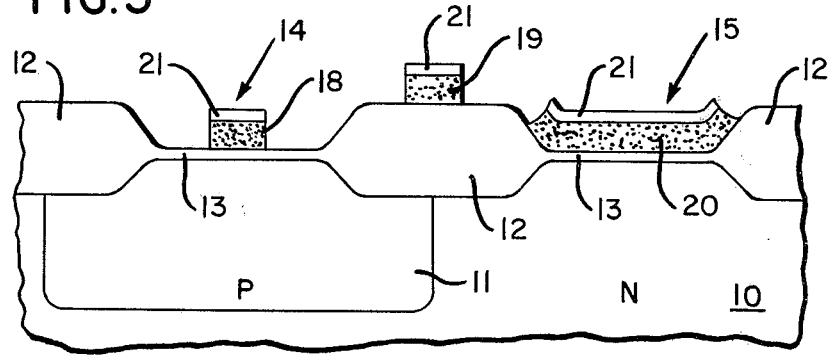
Figure 3A:
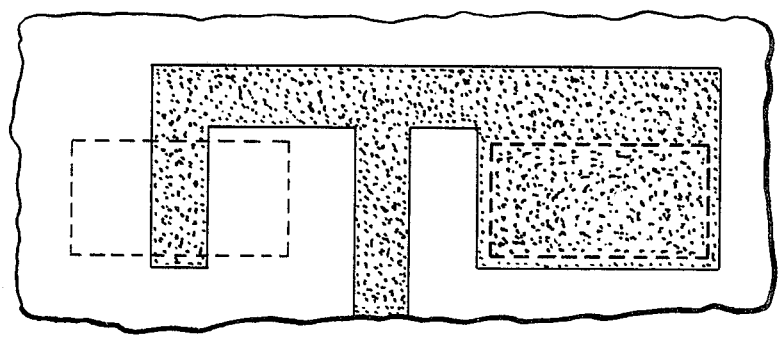
FIG. 3A is a plan-view of FIG. 3.

Next, as shown in FIG. 2, the polysilicon gates and interconnects (that is, conductors) are formed by depositing a layer of polycrystalline silicon 16 to the desired thickness over the entire structure using conventional techniques such as low pressure chemical vapor deposition (LPCVD), or pyrolysis of silane ($SiH_4$). The thickness of the polysilicon layer 16 is typically in the range 3,000-8,000 Angstroms (0.3-0.8 microns), the preferred thickness being about 5,000 Angstroms (0.5 microns). Beyond 8,000 Angstroms (0.8 microns), the well-known step-coverage problems during metallization will begin to appear. Below about 3000 Angstroms (0.3 microns), there will be a performance limitation of the device due to long signal propagation times caused by increased resistance of the thin polysilicon interconnections. A silicon oxide masking layer 17 having a thickness typically in the range 500-3,000 Angstroms (0.05-0.3 microns) is then grown on the polysilicon 16 (FIG. 2) using one of the conventional techniques such as steam growth, growth in dry oxygen, pyrolytic decomposition or plasma deposition. A photoresist mask (not shown) is then applied to the oxide layer 17. As shown in FIGS. 3 and 3A, conventional photoengraving techniques are then used to pattern the polysilicon 16 into the gate 18 for the n-channel active region 14, the interconnect 19, and a mask 20 for the p-channel active region 15. Referring to FIG. 3, the portions 21—21 designate the portions of the oxide layer 17 that remain over the patterned polysilicon at the completion of this step.

The oxide masking layer 21 over the polysilicon regions 18, 19, 20 is now removed using a conventional etchant such as buffered hydrofluoric acid. During this step the thin oxide layer 13 in the n-channel active area 14 is also etched away except under the polysilicon mask 20 for the p-channel active region and under the polysilicon gate 18 where the oxide remains intact as the n-channel gate insulator 22 (FIG. 4).

Figure 4:
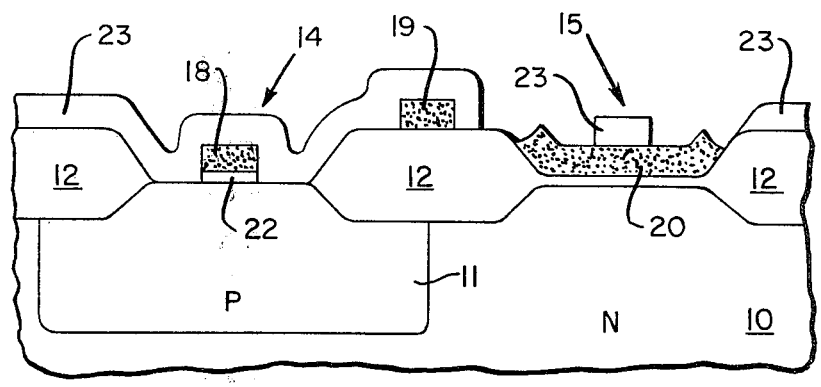

Next, referring to FIG. 4, a layer 23 of a material containing impurities of a chosen conductivity type is formed over the gate area of the p-channel active region 15, over the entire n-channel active region 14 and over the polysilicon interconnect 19. Preferably, the material 23 is arsenosilicate glass (ASG). An example of ASG consists of a solution of an arsenic-doped polymer in alcohol and is sold by Allied Chemical Corporation under the trade name Accuspin and by Emulsitone Company under the trade name Arsenosilicafilm. The process of application of ASG is as follows. A small quantity of the doped polymer in alcohol solution is applied to the structure of FIG. 4. The structure is spun at a rate of 3,000-5,000 rotations per minute to obtain uniform coating. The structure is placed in an oven at a temperature of 150°-200° C. for about 10-30 minutes to drive off the solvents from the ASG. The thickness of the ASG layer following the complete evaporation of the solvents is approximately 1,500 Angstroms (0.15 microns).

Then, using conventional photolithographic techniques, the layer 23 of arsenosilicate glass is patterned to provide the configuration shown in FIG. 4. ASG layer 23 now completely masks the entire n-channel active region 14 and the polysilicon interconnections 19, but masks only the gate area of the p-channel active region 15.

Referring to FIG. 5, the next step in the present process is to form p-channel gate electrode 24 by etching away the polysilicon in the active region 15 outside the arsenosilicate glass. A suitable etchant is a mixture of hydrofluoric acid, acetic acid, and nitric acid. Plasma etching can also be used.

It may be desirable at this stage of the present process to perform a short step of dry thermal oxidation of the polysilicon gate walls 24A (FIG. 5) to prevent penetration of p-type impurities (to be implanted subsequently as explained below) into the polysilicon gate side walls. This step, however, is not essential to this invention.

Referring to FIG. 5, p-type impurities (typically boron) are then implanted by conventional ion implantation into the active region 15 to form the p+ source 25 and drain 26 therein. A typical boron implantation utilizes an energy of 30-100 kev and a dose of $10^{15}$ ions per square centimeter. The resulting source and drain junction depth can be quite shallow, of the order of 0.3 microns. The junction depth, increases after the annealing step described below, to the final, desired dimension. From the foregoing sequence of steps it is clear that the p+ source 25 and drain 26 are self-aligned to the overlying polysilicon gate 24. This is a much desired feature, because it eliminates stray capacitances such as gate overlap capacitance and increases the speed of the device.

Next, the n+ drive-in diffusion step is accomplished by introducing the structure of FIG. 5 into a furnace having an inert atmosphere such as dry gaseous nitrogen atmosphere at a high temperature in the range of 900°–1,100° C. for a period of about 0.5–4 hours. During this step arsenic ions from the arsenosilicate glass form the n+ source 27 and drain 28 of the n-channel active region 14 and, at the same time, diffuse into the polysilicon areas to establish the high conductivity of the now n+ polysilicon gates 18 and 24 and the n+ polysilicon interconnections 19 (FIG. 6). During this step the previously implanted boron ions in source 25 and drain 26 diffuse deeper into the silicon substrate to the desired concentration profile. The junction depth at the completion of this step is typically 0.3–0.8 microns for the n+ junction and 0.8–1.5 microns for the p+ junction. During this step gates 18 and 24 mask the channel regions from the arsenic ions.

The determining factor in selecting the order in which the preceding two steps are carried out is the controllability of the boron penetration depth. At drive-in temperatures of greater than about 1,000° C., for example, it is preferable to carry out the n+ drive-in first as indicated by the dashed source and drain in FIG. 5, otherwise the implanted boron ions, due to their generally higher mobility at these higher temperatures, penetrate too deep in the p-channel source 25 and drain 26, thereby adversely affecting the p-FET threshold voltage. At drive-in temperatures below about 1,000° C., however, the boron implantation may be accomplished first, followed by the arsenic drive-in.

Another possibility, regardless of the drive-in temperature, is simultaneous drive-in of boron during the arsenic drive-in of FIG. 6.

It will be appreciated that an anneal step may be used, as desired, to repair any structural damage caused by ion implantation and to activate the implanted species.

Prior to the drive-in diffusion step an oxidation step may be used to form a thin insulating layer 29 (FIG. 6) of thermally grown oxide over the arsenosilicate glass layer. The layer 29 will prevent undesirable outgassing of arsenic from the upper surface of the arseno-silicate glass and will also protect the device from possible autodoping. This capping oxide step, while not essential to the present invention per se, is recommended in the interests of safety and better yields.

Next, the arsenosilicate glass layer 23 (and the capping oxide 29, if it was formed) is (are) etched away using a conventional etchant such as hydrofluoric acid. During this step the gate thickness oxide 13 in the active region 15 (FIG. 6) is also etched away except under the polysilicon gate 24 where the oxide remains intact as the p-channel gate insulator 30 as shown in FIG. 7.

The processing at this point is substantially complete as far as the novelty of the present invention is concerned. The balance of the processing is generally conventionally performed. Referring to FIG. 8, this includes forming a thick oxide 31—31, opening contact holes, defining metal conductors 32—32, and forming a passivation layer 33—33 over the circuit.

Figure 4A:
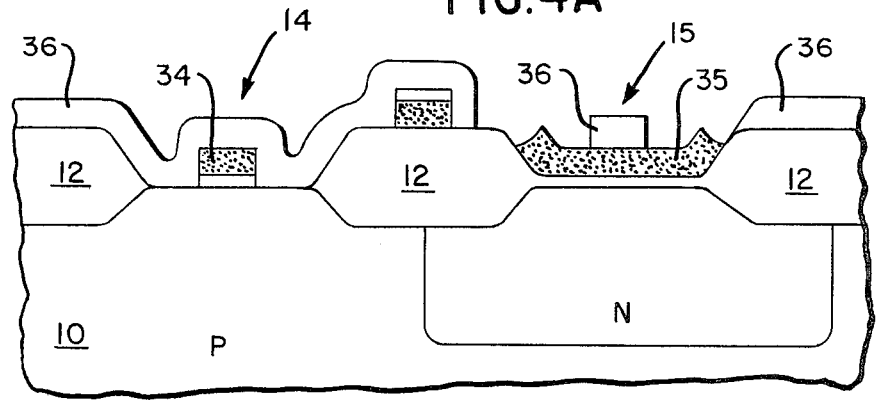
FIG. 4A illustrates in a cross-sectional view an alternative embodiment.

Although the CMOS device of the present invention has been described in detail by selecting an n-type substrate having a p-well, the invention is fully applicable to a p-type substrate having an n-well as shown in FIG. 4A. In the latter case, the polysilicon is patterned such that a polysilicon gate electrode 34 is formed in the n-channel region (i.e., the p-substrate) and the p-channel region (i.e., the n-well) is completely covered with the polysilicon layer 35. Layer 35 is then etched using arsenosilicate glass layer 36 as a mask. Layer 36 completely masks the n-channel active region. The remaining steps are the same as those described in connection with FIGS. 5–8.

The invention described above is a process tailored to permit n+ polysilicon gate doping for both p-channel and n-channel CMOS FETs and n+ doping of the polysilicon interconnections. This process may also be advantageously adopted to form p+ doped polysilicon gates and interconnections by substituting borosilicate glass (BSG) in place of arsenosilicate glass. It will be appreciated that devices having all p+-doped polysilicon gates and interconnections are not suitable for CMOS VLSI circuits unlike the devices having all n+ polysilicon gates and interconnections since the former must necessarily have thick gate oxide layers (of the order of at least 1,000 Angstroms (0.1 microns)) in order to overcome the boron penetration problems discussed above.

By carrying out the above process, four different types of CMOS FETs may be obtained by means of only two masking steps, i.e., the steps illustrated in FIGS. 4 and 5. These are: (1) n-substrate device with all n+ polysilicon gates and interconnects, (2) n-substrate device with all p+ polysilicon gates and interconnects, (3) p-substrate device with all n+ polysilicon gates and interconnects, and (4) p-substrate device with all p+ polysilicon gates and interconnects. The advantages of this process include self-aligned gates, all-n+-doped or all-p+-doped polysilicon gates and interconnections, and fewer masking steps than the conventional process. This leads to better yields and a reduction in cost.

While the invention has been particularly shown and described with reference to preferred embodiments thereof, it will be understood by those skilled in the microelectronics art that the foregoing and other changes in form and details may be made without departing from the spirit and scope of the invention.

I claim:

1. In a process for forming an integrated circuit from a structure comprising a body of semiconductor material having a first active region of a first conductivity type, a second active region of the second conductivity type, a relatively thin silicon dioxide layer formed over said active regions, the improvement comprising:

forming a first polysilicon gate over said first active region and a polysilicon layer over said second active region;

forming a mask containing impurities of the second conductivity type over the structure and laterally encompassing the first active region and defining a gate region in the second active region;

forming the polysilicon layer in the second active region to a second polysilicon gate defined by the mask;

implanting the first-conductivity-type impurities in source and drain regions defined in the second active region by the mask; and diffusing the second-conductivity-type impurities from the mask into source and drain regions defined in the first active region by the first polysilicon gate and into both the first and second polysilicon gates;

the combination of implantation and diffusion forming a self-aligned source and drain in each of the first and second active regions, and both polysilicon gates doped with said second conductivity type impurities.

2. A process for forming a CMOS integrated circuit from a structure comprising a body of n-type semiconductor material having a first and second active regions, respectively, with a p-well formed in the first active region, and a relatively thin silicon dioxide layer formed over said active regions, said process comprising:

forming a first polysilicon gate over the silicon dioxide layer formed in said first active region and a polysilicon layer over the silicon dioxide layer in said second active region;

forming a mask containing n-type impurities over the structure and laterally encompassing the first active region and defining a gate region in the second active region;

forming the polysilicon layer in the second active region to a second polysilicon gate defined by the mask;

implanting p-type impurities in source and drain regions defined in the second active region by the mask;

diffusing the n-type impurities from the mask into source and drain regions defined in the first active region by the first polysilicon gate and into both the first and second polysilicon gates; and the combination of implantation and diffusion forming a self-aligned source and drain in each of the first and second active regions, and n-type doped first and second polysilicon gates.

3. The process as recited in claim 1 or 2 including, prior to said implantation step, the step of diffusing impurities from the mask into the source and drain regions defined in the first active region by the first polysilicon gate, and into both the first and second polysilicon gates.

4. The process as recited in claim 2 wherein the masking layer is arsenosilicate glass.

5. The process as recited in claim 4 further comprising forming prior to the diffusion step a relatively thin layer of silicon dioxide over the mask to prevent surface outgassing of impurities from the mask.

6. The process as recited in claim 2 wherein the thickness of the silicon dioxide layer is 300–1200 Angstroms and the thickness of the polysilicon layer is 3,000–8,000 Angstroms.

* * * * *